United States Patent [19]

Desbiens

[11] Patent Number: 5,239,270
[45] Date of Patent: Aug. 24, 1993

[54] WAFER LEVEL RELIABILITY CONTACT TEST STRUCTURE AND METHOD

[75] Inventor: Donald J. Desbiens, Sebago Lake, Me.

[73] Assignee: National Semiconductor Corporation, Santa Clara, Calif.

[21] Appl. No.: 840,390

[22] Filed: Feb. 24, 1992

[51] Int. Cl.$^5$ .......................................... G01R 31/26
[52] U.S. Cl. .................................... 324/719; 324/500; 324/158 R; 324/158 T
[58] Field of Search ........... 324/719, 537, 500, 158 R, 324/158 T, 158 D

[56] References Cited

U.S. PATENT DOCUMENTS

| | | | |
|---|---|---|---|
| 4,144,493 | 3/1979 | Lee et al. | 324/158 R |
| 4,542,340 | 9/1985 | Chakravarti et al. | 324/158 D X |
| 4,720,670 | 1/1988 | Boyle | 324/158 R X |
| 4,835,458 | 5/1989 | Kim | 324/158 R X |
| 4,906,921 | 3/1990 | Juge | 324/158 D X |
| 4,942,357 | 7/1990 | Chang | 324/158 R |

Primary Examiner—Kenneth A. Wieder
Assistant Examiner—Glenn W. Brown
Attorney, Agent, or Firm—Daniel H. Kane; James W. Rose; Richard C. Calderwood

[57] ABSTRACT

A contact test structure and method provide accelerated testing of long term reliability of metal to silicon ohmic contacts and adjacent PN junctions on IC dies of a wafer. At least one wafer level reliability contact test structure (10) is formed on the wafer during CMOS or BICMOS wafer fabrication mask sequences without additional steps. A shallow layer (N+S/D) of semiconductor silicon material of second type carrier (N) conductivity is formed in a well (PWELL) of first type carrier (P) conductivity silicon material with a shallow PN junction (J) between the shallow layer and well. Metal to silicon first and second test contacts (TC1,TC2) of metal layer portions (M1) are formed at first and second locations on the shallow layer (N+S/D) spaced apart a selected distance. The second test contact (TC2) has a contact area between a metal layer (M1) and shallow layer (N+S/D) in the minimum size range for the fabrication process for maximizing current density through the second test contact (TC2). The first test contact (TC1) has a substantially greater contact area. A large current is forced in a conductive path through the shallow layer (N+S/D) between the first and second test contacts (TC1,TC2). Changes in the resistance of the conductive path caused by changes in the contact resistance of the second test contact TC2 over time are monitored as a function of applied first and second voltages (V1,V2) and forced current. Additional contact test structure is formed on the well with an ohmic contact layer (P+S/D) spaced from the shallow layer (N+S/D) and metal to silicon third test contact (TC3) to detect occurrence of junction spiking.

25 Claims, 1 Drawing Sheet

WAFER LEVEL RELIABILITY CONTACT TEST STRUCTURE AND METHOD

TECHNICAL FIELD

This invention relates to a new wafer level reliability contact test structure for accelerated testing at the wafer stage of the long term reliability of metal to silicon ohmic contacts and adjacent PN junctions formed on integrated circuit (IC) dies on a wafer. The invention provides a new method of forming the contact test structures at selected locations on the wafer during CMOS and BICMOS IC fabrication processes. The invention also provides a new method of accelerated testing using the new contact test structures by accelerated aging and wearout of a metal to silicon test contact. The invention monitors changes in contact resistance at the test contact and subsequent effects such as junction spiking at an adjacent shallow PN junction below the test contact in a compressed time period.

BACKGROUND ART

A limiting factor in the useful life and long term reliability of integrated circuit structures is the migration of materials in the vicinity of metal to silicon contacts caused by the transport characteristics of electrons. This "electromigration" is characterized by physical movement of constituent metal and silicon molecules from different layers through the IC structure. Joule heating from high currents may also cause thermal diffusion or "thermomigration" of the metal and silicon molecules.

Aluminum and aluminum alloys are typically used for the metal layer contacts and have a tendency to "alloy" with silicon. Aluminum may migrate through the metal-semiconductor interface into the underlying silicon, alloying with the silicon. The metal to silicon ohmic contact typically incorporates a step configuration perimeter where the metal layer is applied through an opening in an insulating oxide layer to an underlying active silicon region. Deterioration of the metal layer causes increased resistance of the metal contact particularly at the step locus. The step locus is a site vulnerable to deterioration because current density there may be twice that of other locations aggravating the electromigration of aluminum. This deterioration in the surface metal contact and step coverage and increase in contact resistance leads gradually to a first type of failure or first failure mode by increase in contact resistance beyond the permitted specification for a particular wafer fabrication process.

A second failure mode is caused by migration of the silicon into the metal layer and vice-versa causing voids in the epitaxial layer or substrate and at underlying or adjacent PN junctions. Such voids at a PN junction are referred to as junction "spiking" or "poisoning" and can lead to catastrophic failure with dramatic rise in current across the pN junction.

Steps which have been taken to retard this deterioration and to increase useful life of integrated circuit structures include the use of a titanium-tungsten (Ti—W) layer and other barrier layers between the aluminum and silicon as diffusion/migration barriers. Aluminum alloys such as copper aluminum alloys and silicon aluminum alloys are also used for the metal layers to prevent further alloying of the metal with active area silicon. These expedients only slow the process however, and assessment of the reliability of the integrated circuit metal to silicon contacts at the wafer level is still essential. Process variation in CMOS or BICMOS wafer fabrication processes may result in poor contact step coverage or other detrimental effects. It is therefore desirable to provide testing of the reliability of metal to silicon contacts of dies on wafers at the wafer level for assessment of the particular process quality.

A typical CMOS wafer fabrication process generally follows the following mask sequence and associated mask steps set forth in TABLE I. A further description is found in the Jeffrey B. Davis and Stephen C. Park U.S. patent application Ser. No. 713,027, filed Jun. 7, 1991, a division of U.S. patent application Ser. No. 510,227, filed Apr. 17, 1990 for ELECTROSTATIC DISCHARGE PROTECTION TRANSISTOR ELEMENT AND FABRICATION PROCESS, and in the Murray J. Robinson and Christopher C. Joyce U.S. patent application Ser. No. 802,878 filed Dec. 6, 1991 for HIGH DEFINITION HIGH RESISTANCE RESISTOR STRUCTURE AND FABRICATION PROCESS.

TABLE I

CMOS WAFER FABRICATION MASK SEQUENCES

| Mask No. | Mask Function/Name |
|---|---|
| 0 | PWELL Definition Mask |
| 1.0 | Active Area Definition Mask |
| 2.0 | PWELL Field Implant Mask |
| 3.0 | Poly Definition Mask |
|   | (Gate Definition Mask For CMOS Transistors) |
| 4.0 | N+S/D Source/Drain Implant Mask |
|   | (Self-Aligned NMOS Transistor Mask) |
| 4.1 | P+S/D Source/Drain Implant Mask |
|   | (Self-Aligned PMOS Transistor Mask) |
| 5.0 | Contact Definition Mask |
| 6.0 | Metal 1 (M1) Definition Mask |
| 7.0 | VIA Mask |
|   | (Second Contact Definition Mask) |
| 8.0 | Metal 2 (M2) Definition Mask |
| 9.0 | Passivation Definition |

The CMOS wafer fabrication process typically begins with a substrate of N type silicon semiconductor material prepared with an N— silicon epitaxial layer and thin protective layers of thermally grown silicon dioxide $SiO_2$ and silicon nitride $Si_3N^4$. A photoresist layer is "spun on" and patterned to provide the 0 Mask or PWELL Definition Mask defining the P— type wells or PWELLS for NMOS transistor elements. The nitride layer is stripped in a dry etch over the PWELL area and PWELLS are established by a P— boron ion implant. As used herein the plus and minus signs indicate the relative concentration of N type or P type dopant material in the respective silicon semiconductor region and the relative conductivity of the silicon regions. In subsequent steps an N— implant of N type dopant material ions such as phosphorus ions establishes the N— type wells or NWELLS for PMOS transistor elements outside the PWELL areas.

In due course a new nitride layer is deposited and the nitride layer is patterned and etched using the photoresist 1.0 Active Area Definition Mask. The Active Area Definition Mask and etch step leaves islands of silicon nitride over the PWELLS AND NWELLS coinciding with the active areas for NMOS and PMOS transistor elements respectively. The 1.0 Mask and resulting nitride islands define the channel width of the respective NMOS & PMOS transistor elements.

The photoresist 2.0 PWELL Field Implant Mask is next formed covering the NWELLS followed by the P+ field implant. The 2.0 PWELL Field Implant Mask, also referred to as the N Channel Field Implant Mask, is similar to the 0 Mask or PWELL Definition Mask but leaves openings slightly larger for example 2u beyond the original PWELL areas. The P+ field implant establishes P+ channel stop regions to increase the threshold voltage or turn on voltage $V_{TON}$ of parasitic transistor structures that arise between active areas across the field oxide. Following the P+ field implant and stripping of the 2.0 Mask the field oxide regions are grown between the nitride islands. The field oxide or FOX surrounds the nitride islands for isolating the active areas. The nitride islands prevent growth of FOX in the active areas of the NMOS and PMOS transistor elements. The nitride islands are then stripped from the chip and other steps follow.

A poly layer is patterned using the 3.0 Poly Definition Mask, and the poly definition mask and etch steps leave gates of polysilicon over the active areas. The poly gates are smaller than the active areas of the respective transistor elements and define the channel length of the respective transistor elements. The photoresist 3.0 Poly Definition Mask thus also functions as the gate definition mask for CMOS transistor elements.

The poly gates for the NMOS transistor elements over the PWELLS in combination with the photoresist 4.0 N+S/D Source/Drain Implant Mask provide a self-aligned transistor mask for the NMOS transistor elements. An N+implant follows establishing the N+drain and source regions for the NMOS transistor elements.

The photoresist 4.1 P+S/D Source/Drain Implant Mask is similar to the 4.0 Mask but covers the PWELLS and active areas for the NMOS transistor elements. In effect the 4.1 Mask and associated 4.1 Mask steps are the inverse of the 4.0 Mask and associated 4.0 Mask steps.

Upon completion of implant of the source and drain regions, the photoresist 4.0 and 4.1 Masks are stripped and a blanket passivating layer of for example, low temperature semiconductor material oxide (LTO) is deposited. The LTO or other passivating material may be deposited by chemical vapor deposition. The blanket passivating layer is patterned and etched using the photoresist 5.0. Contact Definition Mask for defining and establishing the openings in the LTO or other passivating material layer for metal contacts from the Metal 1 or M1 layer.

For the CMOS transistor elements, the LTO layer provides an insulating passivating layer over the poly gate and between the poly gate and M1 layer. The 5.0 Contact Definition Mask defines the metal conductor contacts to the source and drain regions. The first metal layer is deposited over the patterned passivating layer and the Metal 1 or M1 layer is masked and etched using the 6.0 M1 Definition Mask leaving the source and drain metal contacts and conductors which may be formed in the step configuration.

A second LTO layer or other interlayer dielectric (ILD) material layer is deposited, masked and etched using the 7.0 VIA Mask which defines openings for contacts between a second metal layer or M2 layer and the M1 layer including the openings for bond pads. The 7.0 VIA Mask is a second contact definition mask for the second LTO or ILD layer. The second metal layer is deposited, masked and etched using the photoresist 8.0 M2 Definition Mask. The second metal layer M2 in parallel with the first metal layer M1 reduces current density etc. The final steps include depositing a passivating nitride layer over the entire chip followed by the photoresist 9.0 Passivation Definition Mask and etch steps for opening the bond pads.

A BICMOS IC fabrication process for fabricating both bipolar and CMOS transistor structures currently in use at National Semiconductor Corporation, South Portland, Me. 04106 is summarized in TABLE II showing the overall BICMOS mask sequence and associated mask steps. Further description of the BICMOS process mask sequences is found in the Murray J. Robinson, Christopher C. Joyce, and Tim Wah Luk U.S. patent application Ser. No. 655,676 filed Feb. 14, 1991 for BIPOLAR TRANSISTOR STRUCTURE AND BICMOS IC FABRICATION PROCESS, and the Robinson, Joyce, and Luk U.S. patent application Ser. No. 803,214 filed Dec. 6, 1991 for SCHOTTKY DIODE STRUCTURE AND FABRICATION PROCESS.

TABLE II

| BICMOS WAFER FABRICATION MASK SEQUENCES | |
|---|---|
| Mask No. | Mask Function |
| 1.0 | Buried Collector Layer (BCL) Mask |
| 2.0 | Retro NWELL Mask and Retro SEC Mask |
| 3.0 | Retro PWELL/Channel Stop (CHST) Mask |
| 4.0 | Isolation Oxide (ISOX) Mask |
| 5.0 | Sink Implant & ISOX Gettering Mask |
| 6.0 | CMOS Active Area Definition Mask (Field Oxide Mask) & Collector Base Surface Spacer (CBSS) Definition Mask |
| 7.0 | Active Strip Mask |
| 8.0 | Poly Gate Definition Mask |
| 9.0 | Base Definition Mask |
| 10.0 | Nitride Etch Mask or Collector Base & Emitter Contact Definition Mask |
| 11.0 | Emitter & Collector Sink Implant Mask (Self-Aligned Transistor Mask) |
| 12.0 | N+S/D Source/Drain Mask (NMOS) |
| 13.0 | P+S/D Source/Drain Mask (PMOS) |
| 14.0 | CMOS Contact Definition Mask |
| 15.0 | METAL 1 (M1) Deposition Mask |
| 16.0 | VIA Mask (Inter Layer Dielectric Mask) |
| 17.0 | METAL 2 (M2) Deposition Mask |
| 18.0 | Passivation Mask |

A buried collector layer BCL for bipolar transistors is formed typically in P type substrate using the 1.0 BCL mask etch and implant sequence at the beginning of the BICMOS wafer fabrication process. Relatively slow diffusing N type antimony atoms are implanted in the P type substrate to an N+ concentration through an initial oxide layer. A new photoresist layer is then deposited to form the 2.0 mask. The 2.0 NWELL mask sequence provides not only the retro NWELL definition and implant mask with an NWELL opening for the CMOS transistor structure, but also a subemitter collector (SEC) region definition and implant mask with an SEC opening for the bipolar transistor structure. By way of example the SEC opening in the 2.0 mask is formed with a horizontal area of approximately 10% and preferably in the range of 10% to 20% of the horizontal cross section area of the BCL. Relatively fast diffusing phosphorous atoms are implanted to an N+ concentration level through the 2.0 mask. Phosphorous atoms are used for the N+ concentration implant of the SEC and NWELL regions for faster up diffusion during subsequent annealing steps as hereafter described to provide retrograde concentrations extending into the subsequently deposited epitaxial EPI.

The 3.0 mask, etch and implant sequence or 3.0 PWELL mask sequence is used for defining and implanting the retro PWELL region of the CMOS transistor structure and the channel stop regions CHST adjacent to the bipolar transistor structure. Boron atoms are implanted to a P+ concentration level in the PWELL and CHST regions. A single crystal epitaxial layer of N− silicon is then deposited uniformly over the BICMOS IC structure in a blanket epitaxial deposition without a mask.

Isolation oxide regions are established around the bipolar transistor structures using the 4.0 isolation oxide mask, etch and oxidation sequence. The collector sink region CS is implanted with an N+ concentration of phosphorous atoms using the 5.0 sink mask, etch and implant sequence The 5.0 mask is also formed for implanting the isolation oxide regions ISOX with the phosphorous atoms as a gettering agent. A uniform nitride layer is deposited in a blanket chemical vapor deposition across the BICMOS structure.

The 6.0 Active Area Definition Mask or Active Mask is formed for etching the nitride layer and defining the active regions of the CMOS transistor structure. The openings in the 6.0 active mask define the framing field oxide regions FOX for framing the CMOS transistor structures during the subsequent oxidation step.

At the same time the 6.0 active mask also functions as the collector base surface spacer region CBSS definition mask for the bipolar transistor structure. In the subsequent field oxidation step, the collector base surface spacer region CBSS is formed from the field oxide rather than isolation oxide.

In the 7.0 active strip mask steps the nitride layer is stripped except over the bipolar transistor structure and the active areas of the CMOS transistor structure are opened to expose the epitaxial silicon. The gate oxide layer GOX is grown and polysilicon (POLY) is deposited in one or two layers with doping to adjust the threshold voltage for the CMOS transistor structure. The 8.0 poly gate definition mask steps define the gates for CMOS transistors using a photoresist layer and photolithographic stepper followed by etching the poly layer and leaving behind the poly gates over the gate oxide layer. A thin oxide layer referred to as a sealing oxide or spacer oxide is grown over the poly gates.

The 9.0 base mask, etch and implant sequence is used for defining and implanting the base of the bipolar transistor structure with P type boron atoms. The 10.0 nitride etch mask provides a collector, base and emitter contact definition mask which is a self-aligned transistor (SAT) nitride mask over the bipolar transistor structure. The epitaxial oxide layer EPIOX remains over the bipolar transistor structure with the nitride mask defining the collector, base and emitter contacts.

The 11.0 emitter and collector sink implant mask is modified to utilize the underlying nitride SAT mask over the bipolar transistor structure. The emitter and collector sink regions are implanted to an N+ concentration level with N type arsenic atoms. While previous annealing steps have begun development of the retrograde concentration upward from the PWELL, NWELL, and the SEC region, the subsequent annealing step following implant of the emitter and collector sink regions fully develops most of the retrograde concentration profile of dopant atoms.

A blanket N− arsenic implant precedes the 12.0 N+S/D source/drain mask, etch and implant sequence for the NMOS transistor elements. The N+S/D source/drain implant is a phosphorous implant over the arsenic. The combination of the N− arsenic implant and N+ phosphorous implant develops a profiled lightly doped drain for the NMOS transistor element of the CMOS transistor pair. The 13.0 P+S/D source/drain mask, etch and implant sequence is used for implanting the source and drain regions of the PMOS transistor structure.

Following the source/drain mask, etch and implant sequences for the NMOS and PMOS transistor elements of the CMOS transistor structure, a blanket low temperature oxide layer LTO is deposited over the BICMOS structure. The 14.0 CMOS contact definition mask and etch sequence removes the LTO over the CMOS metal contact areas and over the bipolar transistor structure. The SAT nitride mask remains permanently on the bipolar transistor structure for defining the bipolar transistor metal contact areas. In subsequent mask steps the first metal layer is deposited using the Metal 1 or M1 mask and deposition sequence followed by blanket deposition of an interlayer dielectric (ILD). The ILD is masked and etched using the 16.0 VIA mask followed by deposition of the second metal layer using the 17.0 Metal 2 or M2 mask and deposition sequence. The final 18.0 passivation etch and mask sequence cuts holes in the nitride layer for bond pads.

OBJECTS OF THE INVENTION

It is an object of the present invention to provide a new contact test structure and method for accelerated testing at the wafer stage of long term reliability of integrated circuit structures formed by CMOS and BICMOS IC fabrication processes.

Another object of the invention is to provide a new contact test structure and method which provides accelerated aging and wearout of a metal to silicon test contact and adjacent PN junction. The invention therefore is able to monitor long term changes in contact resistance and occurrence of junction spiking in a compressed time period of hours or minutes rather than weeks and days. The invention can also provide accurate and rapid feedback of information on the quality of the CMOS or BICMOS wafer fabrication process and wafer batch for process control.

A further object of the invention is to provide a new method of fabricating the contact test structures and adjacent PN junctions using existing mask sequences and steps from CMOS and BICMOS IC wafer fabrication processes without requiring additional steps.

DISCLOSURE OF THE INVENTION

In order to accomplish these results, the invention provides a method of accelerated testing of long term reliability of metal to silicon contacts on an integrated circuit (IC) wafer by forming a contact test structure (10) of horizontal overlying layers on the wafer during wafer fabrication. A relatively deep layer (PWELL) and a shallow layer (N+S/D) of respective first and second type carrier (P,N) conductivity silicon material form a shallow PN junction (J) between the layers (N+S/D,PWELL). Metal to silicon first and second test contacts (TC1,TC2) are formed of respective metal layer portions (Ml) at spaced apart locations on the shallow layer (N+S/D). The second test contact (TC2) has a metal layer to silicon test contact area substantially smaller than that of the first test contact (TC1).

The method proceeds by forcing a test current through a conductive path between the first and second test contacts (TC1,TC2) through the shallow layer (N+S/D) with current density through the second test contact (TC2) substantially exceeding a current density specification for the wafer in order to accelerate electrical stress at the second contact (TC2). Another step provides for measuring changes in contact resistance through the conductive path as a result of accelerated aging at the second test contact (TC2).

The method includes further steps of forming an overlying contact layer (P+S/D) of first type carrier conductivity silicon material in the relatively deep layer (PWELL) spaced laterally from the shallow layer (N+S/D); forming a metal to silicon third test contact (TC3) of a metal layer portion (M1) on the contact layer (P+S/D); and measuring leakage current from the first and second test contacts (TC1,TC2) through the shallow PN junction (J) at the third test contact (TC3) to detect occurrence of junction spiking at the shallow PN junction.

An advantage of the invention is that the wafer level reliability contact test structure may be constructed during a CMOS of BICMOS wafer fabrication process without additional steps. This is accomplished by forming the relatively deep layer (PWELL) of first type carrier conductivity silicon material as a P type well during a CMOS or BICMOS fabrication process PWELL mask sequence; forming the shallow upper layer (N+S/D) of second type carrier conductivity silicon material as an N+ type shallow layer during a CMOS or BICMOS fabrication process N+S/D mask sequence; and forming the contact layer (P+S/D) of first type carrier conductivity silicon material as a P+ type contact layer during a CMOS or BICMOS fabrication process P+S/D mask sequence.

Additional CMOS and BICMOS IC wafer fabrication steps that may be used without requiring additional steps include isolating the shallow layer (N+S/D) and contact layer (P+S/D) by field oxide (FOX) during a CMOS or BICMOS fabrication process active area definition mask sequence; and isolating the metal layers (M1) of the first, second, and third test contacts (TC1,TC2,TC3) by low temperature oxide (LTO) during CMOS or BICMOS fabrication process blanket LTO deposition, contact definition mask sequence, and METAL 1 deposition and etch mask sequence.

The step of forcing a test current between the first and second test contacts (TC1,TC2) through the shallow layer (N+S/D) is accomplished by applying at the first contact (TC1) a relatively high reverse biasing first voltage (V1) less than the breakdown voltage (BVDSSN) across the shallow PN junction (J). A relatively low reverse biasing second voltage (V2) is applied at the second contact (PC2). The step of measuring leakage current at the third test contact (TC3) is accomplished by applying a third voltage (V3) at substantially ground potential at the third test contact (TC3). In the preferred example, the ratio of metal layer to silicon contact areas of the respective first and second test contacts (TC1,TC2) is at least 10/1.

The invention also provides a new integrated circuit (IC) wafer level reliability contact test structure on a wafer for accelerated testing of long term reliability of metal to silicon ohmic contacts on the wafer. The new test structure incorporates a well (PWELL) of first type carrier (P) conductivity silicon material, a shallow layer (N+S/D) of second type carrier type (N) conductivity silicon material formed in the well, and a shallow PN junction (J) between the shallow layer and well.

Metal to silicon first and second test contacts (TC1,TC2) comprising metal layer portions (M1) formed at first and second spaced apart locations on the shallow layer (N+S/D) are separated by an insulating layer (LTO) formed over the shallow layer (N+S/D). The second test contact (TC2) is formed with a metal layer (M1) to shallow layer (N+S/D) contact area in the minimum size range of the wafer fabrication process for maximizing current density through the second contact (TC2). The first test contact (TC1) is formed with a metal layer (MI) to shallow layer (N+S/D) first contact area substantially greater than the second contact area for achieving relatively low current density through the first test contact (TC1).

The contact test structure may include a first voltage source (V1) coupled to the first test contact (TC1) applying a relatively large reverse biasing first voltage at the first contact less than the breakdown voltage (BVDSSN) of the shallow PN junction (J) between the shallow layer (N+S/D) and well (PWELL). A second voltage source (V2) is coupled to the second test contact (TC2) applying a second relatively small reverse biasing voltage at the second test contact (TC2).

Additional contact test structure incorporates an ohmic contact layer (P+S/D) of first type carrier (P) conductivity silicon material formed in the well and spaced horizontally or laterally from the shallow layer (N+S/D). A metal to silicon third test contact (TC3) of a metal layer portion (M1) is formed over the contact layer (P+S/D) to detect leakage current from the first and second test contacts (TC1,TC2) across the shallow PN junction (J) between the shallow layer (N+S/D) and the well (PWELL). The additional contact test structure may include a third voltage source (VI) coupled to the third test contact (TC3) applying a third voltage substantially at ground potential at the third test contact (TC3).

In the preferred example, the shallow layer (N+S/D) and contact layer (P+S/D) are separated by field oxide (FOX). The well (PWELL) is a P type well in a P− type substrate, the shallow layer (N+S/D) is an N+ type shallow layer, and the contact layer (P+S/D) is a P+ type contact layer. Specifically, the well (PWELL) is a CMOS PWELL, the shallow layer (N+S/D) is a CMOS N+S/D layer, and the contact layer (P+S/D) is a CMOS P+S/D layer. The shallow layer (N+S/D) and contact layer (P+S/D) are separated by a CMOS field oxide layer (FOX). The metal layer portions (M1) of the first, second, and third test contacts (TC1,TC2,TC3) are separated by a CMOS low temperature deposited silicon dioxide layer (LTO).

Other objects, features and advantage of the invention are apparent in the following specification and accompanying drawings.

DESCRIPTION OF PREFERRED EXAMPLE EMBODIMENTS AND BEST MODE OF THE INVENTION

Figure 1:
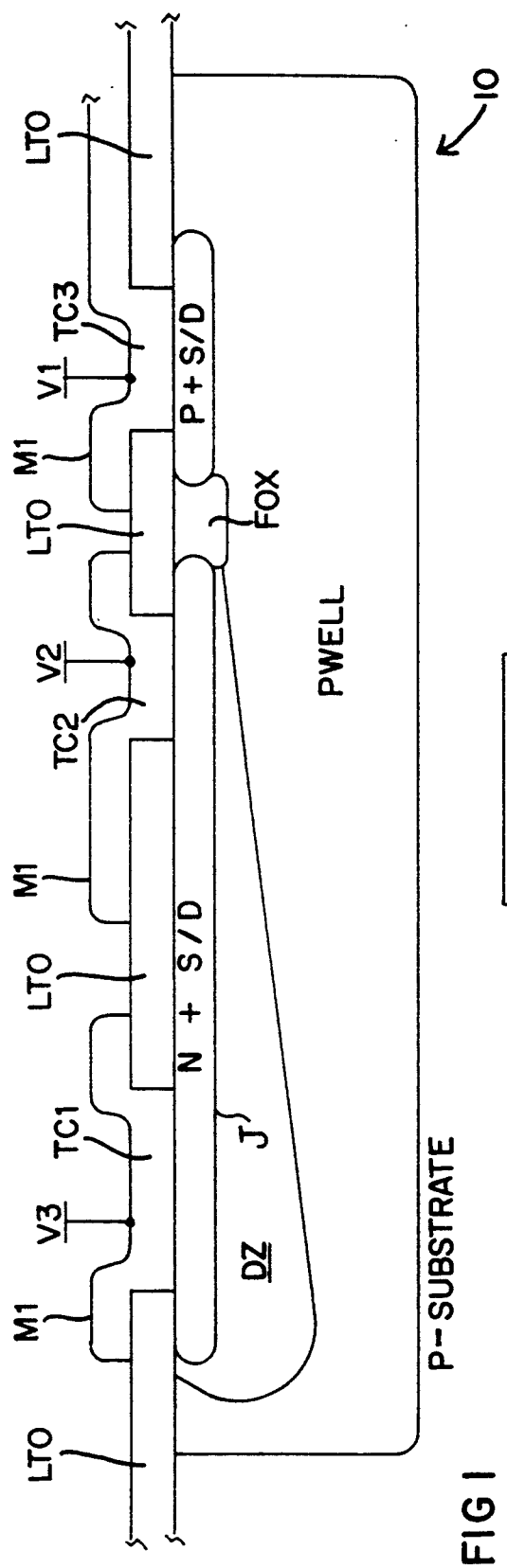
FIG. 1 is a simplified diagrammatic side view of the new wafer level reliability contact test structure according to the invention showing the constituent layers of the structure.
Figure 2:
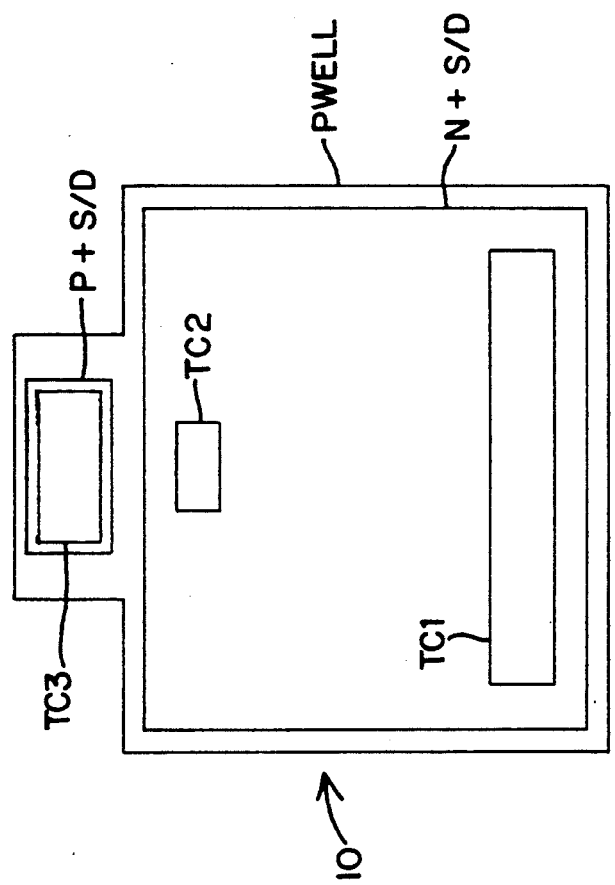
FIG. 2 is a simplified diagrammatic plan view showing mask layouts in overlying configuration for construction of the contact test structure during a CMOS or BICMOS wafer fabrication process.

A wafer level reliability contact test structure 10 according to the invention is illustrated in FIGS. 1 and 2. The contact test structure 10 was constructed in the course of the BICMOS IC wafer fabrication process of TABLE II. A number of such contact test structures 10 may be distributed across the wafer. A relatively deep layer or well PWELL of P type carrier conductivity silicon is formed on a P− substrate as a P type well during the BICMOS wafer fabrication process 3.0 PWELL mask sequence. The 3.0 PWELL mask is modified to provide the contact test structure PWELL mask opening as shown in FIG. 2. A shallow layer N+S/D of N type carrier conductivity silicon is formed as an N+ type shallow layer on the surface of the PWELL during the BICMOS wafer fabrication process 12.0 N+S/D mask sequence. The 12.0 N+S/D mask is modified to provide the contact test structure N+S/D mask opening as shown in FIG. 2. The relatively deep layer PWELL and overlying shallow layer N+S/D form a shallow PN junction J laterally or horizontally between the layers.

An overlying contact layer P+S/D of P type carrier conductivity silicon is also formed on the surface of the relatively deep layer PWELL spaced from the N type carrier silicon shallow layer N+S/D. The contact layer P+S/D is formed as a P+ type layer during the BICMOS IC wafer fabrication 13.0 P+S/D mask sequence. The 13.0 P+S/D mask is modified to provide the contact test structure P+S/D opening as shown in FIG. 2.

The shallow layer N+S/D and contact layer P+S/D are separated and isolated by a field oxide layer FOX previously prepared during the 6.0 active area definition mask sequence. The 6.0 active area definition mask is modified to define the subsequent shallow layer N+S/D area and contact layer P+S/D area as "active areas" separated by field oxide FOX. Prior to the 14.0 contact definition mask sequence, the dies of the wafer are covered with a blanket low temperature deposited oxide layer LTO. First, second and third metal to silicon contact locations for metal to sequent steps an N− implant of N type dopant material the blanket LTO layer during the 14.0 contact definition mask sequence. The 14.0 contact definition mask is modified to provide the contact test structure metal to silicon contact locations for TC1,TC2, and TC3 as shown in FIG. 2. The metal to silicon contacts TC1,TC2,TC3 are then actually formed during the 15.0 METAL 1 or M1 deposition and etch mask sequence leaving the metal to silicon test contacts TC1,TC2, and TC3 as shown in FIG. 1.

As illustrated in FIG. 2, the first metal to silicon test contact TC1 is substantially larger in area than the second test contact TC2. The small area test contact TC2 is actually formed to the lower limit of size resolution permitted by the particular CMOS or BICMOS wafer fabrication process. For example, for the National Semiconductor Corporation 1.0 BCT (Trademark) BICMOS process a limiting physical size for the second test contact TC2 of approximately $1.5\mu^2$ may be achieved. For the FACT 2.0 (Trademark) CMOS process, a limiting physical size for the second test contact TC2 of approximately $2.0\mu^2$ may be achieved etc. This limiting small size for the test contact TC2 permits over stressing and accelerated aging of the metal to silicon test contact TC2 and underlying shallow PN junction J with high current density substantially exceeding the specification for the wafer as hereafter described. The relatively large surface area of the first test contact TC1 permits a much lower current density focusing the over stressing and accelerated aging at the second test contact TC2. Preferably the ratio of areas of the first metal to silicon test contact TC1 to the second test contact TC2 is in the order of at least 10/1.

For testing reliability of metal to silicon contacts at the wafer level or wafer stage, voltage sources V1,V2 and V3 are coupled respectively to the test contacts TC1,TC2, and TC3. The voltage V1 applied at the first test contact TC1 is selected to reverse bias the underlying shallow PN junction J with a voltage slightly less than the breakdown voltage BVDSSN between the shallow layer N+S/D and the deeper well PWELL which may be, for example, approximately 10 volts. Thus, a large reverse biasing voltage is applied at the first test contact TC1. A substantially lower slight reverse biasing voltage V2 is applied at the second test contact TC2. A third voltage V3 at approximately ground potential is applied to the third test contact TC3 at the contact layer P+S/D. The three voltages V1,V2, and V3 may be related by the following equation:

$$V1 = V2 + BVDSSN - 2V$$

where V3 is held at ground potential. By way of example the following test voltages were used.

$$V3 = 0v$$

$$V2 = 0.1v$$

$$V1 = 8.1v.$$

An advantage of this voltage configuration is that the depletion zone DZ which develops below the shallow PN junction J develops in a profile proportional to the reverse bias voltage applied at the test contacts. As shown in FIG. 1, the depletion zone, that is the zone depleted of P type carriers is greatest below the first test contact TC1 and tapers to only a shallow depletion zone width below the second test contact TC2. This minimum depletion zone width below the second test contact TC2 provides a sensitive PN junction structure to monitor spiking as hereafter described.

This voltage source configuration forces a relatively large current through the shallow layer N+S/D between the first and second test contacts TC1,TC2. With the reverse bias voltages set up according to the example above, and with a typical resistance of approximately 100 ohms in the test path through the first test contact TC1, shallow layer N+S/D, and second test contact TC2, a test current of approximately $8v/100\Omega$ or $80 \text{ mA}/\mu^2$ is forced through the test path. According to the lower limiting size of the second test contact TC2, a very high current density in the order of, for example, $20 \text{ mA}/\mu^2$ to $80 \text{ mA}/\mu^2$ may be forced through the second test contact TC2 for over stressing and accelerated electromigration. The current density through the first test contact structure .TC1 is well below the specification limit for the wafer while the current density through the lower limit sized second text contact TC2 is, for example, an order of magnitude greater. Thus the current density through the second test contact TC2 may be $1E6 \text{ A/cm}^2$, ten times greater than the limiting specification of $1E5 \text{ A/cm}^2$.

The resistance changes through the second test contact TC2 during the over stressing with high current density is monitored by monitoring the voltages V1 and V2 and the current level through the test path. This monitoring of resistance in the current path is actually monitoring the accelerated changes in the test contact resistance of the second test contact TC2 itself. The initial test contact resistance of the second test contact TC2 may be for example 10Ψ of the 100Ω resistance through the path. The wafer specifications may permit a 10% variation in the 10Ω contact resistance of TC2. For the starting value of 10Ω±10% or 1.0Ω, the test path resistance of 100Ω is monitored to determine the occurrence of a greater than 1% change or 1Ω change in the resistance of the test path. Occurrence of a greater than 1% deterioration or 1% increase in resistance in the test path indicates a first type of failure of the metal to silicon test contact TC2 caused by metal step coverage changes and other electromigration of metal irons.

At the same time, leakage current through the shallow PN junction J is monitored at the third test contact TC3. The shallow depletion zone DZ below the second test contact TC2 provides a sensitive test structure for monitoring electromigration of silicon and resulting silicon voids at the PN junction known as junction spiking or junction poisoning. A dramatic rise in current injected across the shallow PN junction into the deeper layer PWELL and monitored at the third test contact TC3 indicates the second type of failure, a catastrophic failure due to junction spiking and "shorting out" of the PN junction. Such a catastrophic failure is indicated by a jump in current collected at the third test contact TC3 and voltage source V3 from a minimal leakage current in picoamps to a leakage current in nanoamps.

By this contact test structure and method, accelerated wafer level reliability testing of the two failure modes may be achieved in a compressed test time of, for example 10 to 30 minutes rather than the conventional testing period requiring weeks. This testing may be performed utilizing conventional testers and test instrumentation for feedback of information for process modification and process quality control. While the invention is described with reference to particular example embodiments it is intended to cover all modifications and equivalents within the scope of the following claims.

I claim:

1. A method of accelerated testing of long term reliability of metal to semiconductor material contacts formed on integrated circuit (IC) dies of a wafer comprising:
   forming a contact test structure (10) of horizontal overlying layers on the wafer during wafer fabrication with a relatively deep layer (PWELL) and a shallow layer (N+S/D) of respective first and second type carrier (P,N) conductivity semiconductor material forming a shallow PN junction (J) between the layers (N+S/D,PWELL);
   forming metal to semiconductor material first and second test contacts (TC1,TC2) of respective metal layer portions (M1) at spaced apart locations on the shallow layer (N+S/D), said second test contact (TC2) having a metal layer to semiconductor material test contact area substantially smaller than the first test contact (TC1);
   forcing a test current through a conductive path between the first and second test contacts (TC1,TC2) through the shallow layer (N+S/D) with current density through the second test contact (TC2) substantially exceeding a current density application for the wafer in order to accelerate electrical stress at the second contact (TC2);
   and measuring changes in contact resistance through the conductive path as a result of accelerated aging at the second test contact (TC2).

2. The method of claim 1 comprising:
   forming an overlying contact layer (P+S/D) of first type carrier conductivity semiconductor material in the relatively deep layer (PWELL) spaced laterally from the shallow layer (N+S/D);
   forming a metal to semiconductor material third test contact (TC3) of a metal layer portion (M1) on the contact layer (P+S/D);
   and measuring leakage current from the first and second test contacts (TC1,TC2) through the shallow PN junction (J) at the third test contact (TC3) to detect occurrence of junction spiking at the shallow PN junction.

3. The method of claim 2 comprising:
   forming the relatively deep layer (PWELL) of first type carrier conductivity semiconductor material as a P type well during a CMOS or BICMOS fabrication process PWELL mask sequence;
   forming the shallow upper layer (N+S/D) of second type carrier conductivity semiconductor material as an N+ type shallow layer during a CMOS or BICMOS fabrication process N+S/D mask sequence;
   and forming the contact layer (P+S/D) of first type carrier conductivity semiconductor material as a P+ type contact layer during a CMOS or BICMOS fabrication process P+S/D mask sequence.

4. The method of claim 3 comprising:
   isolating the shallow layer (N+S/D) and contact layer (P+S/D) by field oxide (FOX) during a CMOS or BICMOS fabrication process active area definition mask sequence;
   and isolating the metal layers (M1) of the first, second, and third test contacts (TC1,TC2,TC3) by low temperature oxide (LTO) during CMOS or BICMOS fabrication process blanket LTO deposition and contact definition mask sequence, and METAL 1 deposition and etch mask sequence.

5. The method of claim 2 wherein the step of forcing a test current between the first and second test contacts (TC1,TC2) through the shallow layer (N+S/D) comprises applying at the first contact (TC1) a relatively high reverse biasing first voltage (V1) less than the breakdown voltage (BVDSSN) across the shallow PN junction (J) and applying at the second contact (PC2) a relatively low reverse biasing second voltage (V2).

6. The method of claim 5 wherein the step of measuring leakage current at the third test contact (TC3) comprises applying a third voltage (V3) at substantially ground potential at the third test contact (TC3).

7. The method of claim 1 wherein the ratio of metal layer to semiconductor material contact areas of the respective first and second test contacts (TC1,TC2) is at least 10/1.

8. A method of accelerated testing of long term reliability of metal to semiconductor material ohmic contacts on a wafer comprising:
   forming at least one wafer level reliability contact test structure (10) on the wafer during wafer fabrication, said contact test structure (10) comprising a shallow layer (N+S/D) of semiconductor material of second type carrier (N) conductivity in a well (PWELL) of first type carrier (P) conductivity semiconductor material with a shallow PN junction (J) between the shallow layer and well, and metal to semiconductor material first and second test contacts (TC1,TC2) of metal layer portions (M1) formed at first and second locations on the shallow layer (N+S/D) spaced apart selected distance to provide a conductive path of specified initial resistance through the shallow layer and first and second test contacts, said second test contact (TC2) having a contact area between a metal layer (M1) and shallow layer (N+S/D) in the minimum size range for the fabrication process for maximizing current density through the second test contact (TC2), said first test contact (TC1) having a contact area between a metal layer (M1) and shallow layer (N+S/D) substantially greater than the second test contact (TC2), the metal layer portions (M1) of the first and second test contacts being isolated by an insulating layer (LTO);

forcing a current in a conductive path through the shallow layer (N+S/D) between the first and second test contacts (TC1,TC2) by applying at the first test contact (TC1) a relatively high reverse biasing first voltage (V1) less than the breakdown voltage (BVDSSN) of the shallow PN junction (J) between the shallow layer (N+S/D) and well (PWELL), and applying at the second test contact (TC2) a relatively low reverse biasing second voltage (V2);

and monitoring changes in the resistance of the conductive path caused by changes in the contact resistance of the second test contact (N+S/D) over time as a function of the applied first and second voltages (V1,V2) and forced current.

9. The method of claim 8 wherein the conductive path between the first and second test contacts (TC1,TC2) is formed with an initial resistance (R), and the applied first and second voltages (V1,V2) are selected to generate a relatively large forcing current so that the current density through the second contact (TC2) substantially exceeds the current density specification for the wafer for accelerated electrical stressing and aging at the second contact (TC2).

10. The method of claim 9 wherein the ratio of metal layer to semiconductor material contact areas of the respective first and second test contacts (TC1,TC2) is at least 10/1.

11. The method of claim 8 comprising:
forming additional contact test structure on the wafer during wafer fabrication comprising a contact layer (P+S/D) of first type carrier (P) conductivity semiconductor material in the well (PWELL) spaced laterally from the shallow layer (N+S/D), and a metal to semiconductor material third test contact (TC3) of a metal layer portion (M1) forming on the contact layer (P+S/D);

and measuring leakage current from the first and second test contacts (TC1,TC2) across the shallow PN junction (J) between the shallow layer (N+S/D) and well (PWELL) at the third test contact (TC3) to detect occurrence of junction spiking.

12. The method of claim 11 wherein the well is a P type well, the shallow layer is an N+ type shallow layer, and the contact layer is a P+ type contact layer.

13. The method of claim 12 comprising:
forming the well (PWELL) during a CMOS or BICMOS fabrication process PWELL mask sequence;
forming the shallow layer (N+S/D) during a CMOS or BICMOS fabrication process N+S/D mask sequence;
and forming the contact layer during a CMOS or BICMOS fabrication process P+S/D mask sequence.

14. The method of claim 13 comprising:
isolating the shallow layer (N+S/D) and contact layer (P+S/D) by field oxide (FOX) during a CMOS or BICMOS fabrication process active area definition mask sequence;
and isolating the metal layer portions (M1) of the first, second, and third test contacts (TC1,TC2,TC3) by a low temperature deposited oxide layer (LTO) during a CMOS or BICMOS fabrication process blanket LTO deposition, contact mask sequence, and METAL 1 deposition and etch mask sequence.

15. The method of claim 11 comprising the step of applying a third voltage (V3) at the third test contact (TC3) at substantially ground potential.

16. An integrated circuit (IC) wafer level reliability contact test structure formed on a wafer for accelerated testing of long term reliability of metal to semiconductor material ohmic contacts on IC dies of the wafer comprising:
a well (PWELL) of the first type carrier (P) conductivity semiconductor material;
a shallow layer (N+S/D) of second type carrier (N) conductivity semiconductor material formed in the well;
a shallow PN junction (J) between the shallow layer (N+S/D) and well (PWELL);
metal to semiconductor material first and second test contacts (TC1,TC2) comprising metal layer portions (M1) formed at first and second spaced apart locations on the shallow layer (N+S/D), said first and second test contacts (TC1,TC2) being separated by an insulating layer (LTO) formed over the shallow layer (N+S/D);
said second test contact (TC2) being formed with a metal layer (M1) to shallow layer (N+S/D) contact area in the minimum size range of the wafer fabrication process for maximizing current density through the second contact (TC2);
said first test contact (TC1) being formed with a metal layer (M1) to shallow layer (N+S/D) first contact area substantially greater than the second contact area for achieving relatively low current density through the first test contact (TC1).

17. The contact test structure of claim 16 comprising:
a first voltage source (V1) coupled to the first test contact (TC1) applying a relatively large reverse biasing first voltage at the first contact less than the breakdown voltage (BVDSSN) of the shallow PN junction (J) between the shallow layer (N+S/D) and well (PWELL);
and a second voltage source (V2) coupled to the second test contact (TC2) applying a second relatively small reverse biasing voltage at the second test contact (TC2).

18. The contact test structure of claim 17 comprising:
an ohmic contact layer (P+S/D) of first type carrier (P) conductivity semiconductor material formed in the well and spaced laterally from the shallow layer (N+S/D);

and a metal to semiconductor material third test contact (TC3) of a metal layer portion (M1) formed over the contact layer (P+S/D), said third test contact (TC3) being constructed for detecting leakage current from the first and second test contacts (TC1,TC2) across the shallow PN junction (J) between the shallow layer (N+S/D) and the well (PWELL).

19. The contact test structure of claim 18 wherein the shallow layer (N+S/D) and ohmic contact layer (P+S/D) are separated by field oxide (FOX).

20. The contact test structure of claim 18 wherein the well (PWELL) is a P type well in a P− type substrate, wherein the shallow layer (N+S/D) is an N+ type shallow layer, and wherein the ohmic contact layer (P+S/D) is a P+ type contact layer.

21. The contact test structure of claim 20 wherein the well (PWELL) is a CMOS PWELL, wherein the shallow layer (N+S/D) is a DMOS N+S/D layer, and wherein the contact layer (P+S/D) is a CMOS P+S/D layer.

22. The contact test structure of claim 21 wherein the shallow layer (N+S/D) and contact layer (P+S/D) are separated by a CMOS field oxide layer (FOX).

23. The contact test structure of claim 22 wherein the metal layer portions (M1) of the first, second, and third test contacts (TC1,TC2,TC3) are separated by a CMOS low temperature deposited silicon dioxide LTO layer.

24. The contact test structure of claim 18 comprising a third voltage source (V1) coupled to the third test contact (TC3) applying a third voltage substantially at ground potential at the third test contact (TC3).

25. The contact test structure of claim 17 wherein the ratio of metal layer to semiconductor material contact areas of the respective first and second test contacts (TC1,TC2) is at least 10/1.

* * * * *